United States Patent
Lee et al.

(10) Patent No.: US 10,403,859 B2
(45) Date of Patent: Sep. 3, 2019

(54) ORGANIC LIGHT-EMITTING DEVICE WITH GRAPHENE ELECTRODE LAYER AND METHOD OF MANUFACTURING THE SAME

(71) Applicant: ELECTRONICS AND TELECOMMUNICATIONS RESEARCH INSTITUTE, Daejeon (KR)

(72) Inventors: Hyunkoo Lee, Daejeon (KR); Byoung-Hwa Kwon, Daejeon (KR); Jeong Ik Lee, Daejeon (KR); Jong Tae Lim, Seoul (KR); Byoung Gon Yu, Yeongdong (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/901,771

(22) Filed: Feb. 21, 2018

(65) Prior Publication Data

US 2018/0190949 A1   Jul. 5, 2018

Related U.S. Application Data

(62) Division of application No. 15/208,554, filed on Jul. 12, 2016, now abandoned.

(30) Foreign Application Priority Data

Aug. 13, 2015   (KR) .................. 10-2015-0114736

(51) Int. Cl.
*H01L 51/56* (2006.01)
*H01L 51/52* (2006.01)
*H01L 51/00* (2006.01)

(52) U.S. Cl.
CPC ............ *H01L 51/56* (2013.01); *H01L 51/003* (2013.01); *H01L 51/0021* (2013.01);
(Continued)

(58) Field of Classification Search
CPC ... H01L 51/56; H01L 51/0021; H01L 51/003; H01L 51/5212
(Continued)

(56) References Cited

U.S. PATENT DOCUMENTS

2012/0211739 A1*  8/2012  Koyama ............... H01B 1/122
                                                      257/40
2013/0032840 A1   2/2013  Cho et al.
(Continued)

FOREIGN PATENT DOCUMENTS

KR   10-2011-0001854 A   1/2011
KR   10-2013-0015099 A   2/2013
(Continued)

OTHER PUBLICATIONS

Jae Hoon Park et al., "Flexible and Transparent Metallic Grid Electrodes Prepared by Evaporative Assembly", ACS Applied Materials & Interfaces, Jul. 7, 2014, pp. 12380-12387, vol. 6, American Chemical Society.

*Primary Examiner* — Robert T Huber

(57) ABSTRACT

An organic light-emitting device includes a substrate, a bottom electrode on the substrate, an organic light-emitting layer on the bottom electrode, and a top electrode on the organic light-emitting layer, wherein the top electrode includes a first electrode part, a grid-shaped or plate-shaped second electrode part on the first electrode part, and an adhesive layer on the second electrode part. The organic light-emitting device includes the top electrode that has low sheet resistance. The top electrode includes a graphene layer as the first electrode part.

13 Claims, 17 Drawing Sheets

(52) U.S. Cl.
CPC ...... *H01L 51/5212* (2013.01); *H01L 51/5215* (2013.01); *H01L 51/5228* (2013.01); *H01L 51/5234* (2013.01); *H01L 51/0024* (2013.01); *H01L 51/5246* (2013.01); *H01L 2251/5315* (2013.01)

(58) Field of Classification Search
USPC .............................. 257/40; 438/22, 99, 652
See application file for complete search history.

(56) References Cited

U.S. PATENT DOCUMENTS

| | | | |
|---|---|---|---|
| 2014/0183478 A1* | 7/2014 | Lee .................. | H01L 51/56 257/40 |
| 2015/0008401 A1 | 1/2015 | Lee et al. | |
| 2015/0243927 A1* | 8/2015 | Sakaguchi ......... | H01L 51/5212 257/40 |
| 2016/0365534 A1* | 12/2016 | Gao .................. | H01L 51/56 |

FOREIGN PATENT DOCUMENTS

| | | |
|---|---|---|
| KR | 10-1328483 B1 | 11/2013 |
| KR | 10-2014-0129856 A | 11/2014 |
| KR | 10-1461978 B1 | 11/2014 |
| KR | 10-2016-0065294 A | 6/2016 |

\* cited by examiner

ORGANIC LIGHT-EMITTING DEVICE WITH GRAPHENE ELECTRODE LAYER AND METHOD OF MANUFACTURING THE SAME

CROSS-REFERENCE TO RELATED APPLICATIONS

This U.S. non-provisional patent application is a divisional of U.S. Ser. No. 15/208,554, filed Jul. 12, 2016, which claims priority under 35 U.S.C. § 119 of Korean Patent Application No. 10-2015-0114736, filed on Aug. 13, 2015, the entire contents of which are hereby incorporated by reference.

BACKGROUND OF THE INVENTION

The present disclosure herein relates to organic light-emitting devices and methods of manufacturing the same, and more particularly, to organic light-emitting devices including an auxiliary electrode and methods of manufacturing the same.

Recently, the demand for a top emission organic light-emitting device has increased as the resolution of monitors or televisions is increased. The reason for this is that, with respect to bottom emission, since an aperture ratio is decreased due to an area occupied by a driving thin film transistor (TFT), brightness may be reduced and an actual light-emitting area per each unit pixel may be reduced as the resolution increases. Accordingly, driving brightness may increase to obtain the same brightness, and this may reduce the reliability of the device and may increase power consumption. For top emission or dual emission, a transparent top electrode is required, and a thin metal layer, such as silver, is used as the top electrode having conductivity as well as transparency. However, since the thin metal layer may have low optical transmittance and high reflectance, the thin metal layer may reduce luminous efficiency and may distort colors. A transparent conductive oxide, instead of the thin metal layer, may also be used as the top electrode. However, since an organic layer may be damaged when the transparent conductive oxide is deposited on the organic layer, the transparent conductive oxide is not being used in an actual product. That is, there is a need to develop an electrode, which is optically transparent, has electrical conductivity, and does not damage the lower organic layer during the formation of the electrode, and a method of manufacturing the electrode.

Recently, graphene receives attention as one of the above-described transparent electrodes. Graphene is structurally and chemically very stable and has conductivity 100 times higher than that of silicon or copper, and a single layer of graphene has an optical transmittance of about 98% in the visible region. That is, the graphene, according to its physical nature, has characteristics suitable for a transparent electrode.

SUMMARY OF THE INVENTION

The present disclosure provides a top electrode of an organic light-emitting device which has low sheet resistance.

An embodiment of the inventive concept provides an organic light-emitting device including a substrate; a bottom electrode on the substrate; an organic light-emitting layer on the bottom electrode; and a top electrode on the organic light-emitting layer, wherein the top electrode may include a first electrode part, a grid-shaped second electrode part on the first electrode part, and an adhesive layer on the second electrode part.

In an embodiment, the first electrode part may include graphene.

In an embodiment, the first electrode part and the adhesive layer may be spaced apart from each other in a direction perpendicular to a top surface of the first electrode part.

In an embodiment, the second electrode part may be surrounded by the adhesive layer, and a bottom surface of the second electrode part may be in contact with a top surface of the first electrode part.

In an embodiment, the second electrode part may include any one of a metal, metal nanoparticles, and metal nanowires.

In an embodiment, the organic light-emitting device may further include a conductive polymer between the first electrode part and the second electrode part.

In an embodiment of the inventive concept, a method of manufacturing an organic light-emitting device includes: providing a substrate; forming a bottom electrode on the substrate; forming an organic light-emitting layer on the bottom electrode; and transferring a top electrode on the organic light-emitting layer, wherein the transferring of the top electrode includes: providing a graphene layer; transferring an auxiliary electrode film on the graphene layer; and bonding a top surface of the organic light-emitting layer and a bottom surface of the graphene layer.

In an embodiment, the transferring of the auxiliary electrode film may include: providing a self-assembled monolayer; forming a grid-shaped or plate-shaped auxiliary electrode part on the self-assembled monolayer; forming an adhesive layer on the auxiliary electrode part; forming a support layer on the adhesive layer; removing the self-assembled monolayer; and bonding a bottom surface of the auxiliary electrode part and a top surface of the graphene layer.

In an embodiment, the forming of the grid-shaped auxiliary electrode part may include: forming a photoresist layer on the self-assembled monolayer; forming a photoresist pattern by etching the photoresist layer; forming a conductive material layer on the graphene layer; and lifting off the photoresist pattern.

In an embodiment, the forming of the grid-shaped auxiliary electrode part may include using an inkjet printing method, an electrohydrodynamic printing method, a gravure offset printing, a gravure printing, a reverse offset printing or a screen printing.

In an embodiment, the forming of the plate-shaped auxiliary electrode part may include: forming a photoresist layer on the self-assembled monolayer; forming a photoresist pattern by etching the photoresist layer; forming a conductive material layer on the self-assembled monolayer; forming a protective layer on the conductive material layer; removing a portion of the protective layer to expose a top surface of the conductive material layer in contact with a top surface of the photoresist pattern; exposing the top surface of the photoresist pattern by etching the conductive material layer; and removing the entire protective layer.

In an embodiment, the method may further include removing the support layer after the transferring of the top electrode.

In an embodiment, the method may further include: providing an auxiliary substrate under the self-assembled monolayer; forming a photoresist pattern between the auxiliary substrate and the self-assembled monolayer; and lifting off the photoresist pattern after the forming of the auxiliary electrode part.

In an embodiment, the transferring of the auxiliary electrode film may include: providing an auxiliary substrate; performing a plasma treatment on a top surface of the auxiliary substrate; forming a grid-shaped or plate-shaped auxiliary electrode part on the auxiliary substrate; forming an adhesive layer on the auxiliary electrode part; forming a support layer on the adhesive layer; removing the auxiliary substrate; and bonding a bottom surface of the auxiliary electrode part and a top surface of the graphene layer.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF PREFERRED EMBODIMENTS

Figure 1:
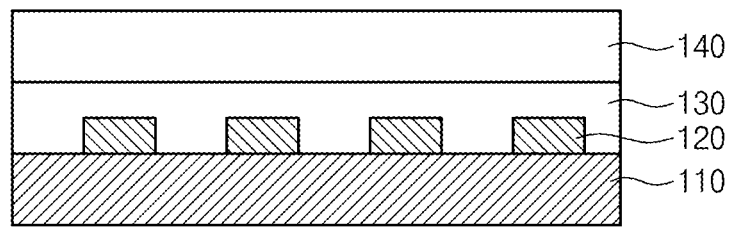
FIG. 1 is a cross-sectional view illustrating an example of a film for a top electrode of an organic light-emitting device according to an embodiment of the inventive concept.

The foregoing and other objects, features and advantages of the present disclosure will become more readily apparent from the following detailed description of preferred embodiments of the present disclosure that proceeds with reference to the appending drawings. The present disclosure may, however, be embodied in different forms and should not be construed as limited to the embodiments set forth herein. Rather, these embodiments are provided so that this disclosure will be thorough and complete, and will fully convey the scope of the inventive concept to those skilled in the art.

In this specification, it will be understood that when a film (or layer) is referred to as being "on" another film (or layer) or substrate, it can be directly on the other film (or layer) or substrate, or intervening films (or layers) may also be present therebetween. Also, in the figures, the sizes and thicknesses of elements are exaggerated for clarity of illustration. Furthermore, though terms like a first, a second, and a third are used to describe various directions and films (or layers) in various embodiments of the present invention, the directions and the films (or layers) are not limited to these terms. These terms are used only to discriminate one direction or film (or layer) from another direction or film (or layer). Therefore, a film referred to as a first film (or layer) in one embodiment can be referred to as a second film (or layer) in another embodiment. An embodiment described and exemplified herein includes a complementary embodiment thereof. As used herein, the term "and/or" includes any and all combinations of one or more of the associated listed items. Like reference numerals refer to like elements throughout.

Figure 2:
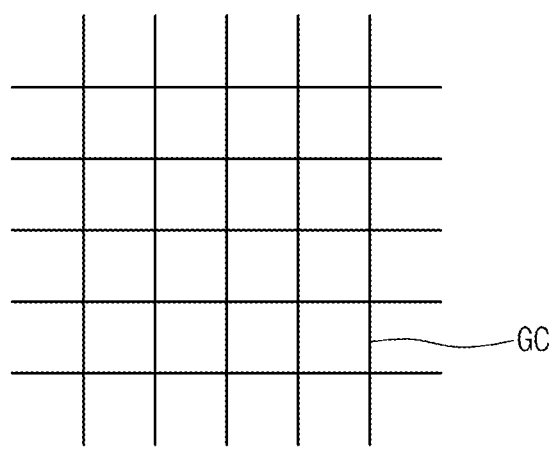
FIGS. 2 through 4 are plan views illustrating second electrode parts of the film for a top electrode of the organic light-emitting device according to the embodiment of the inventive concept.
Figure 3:
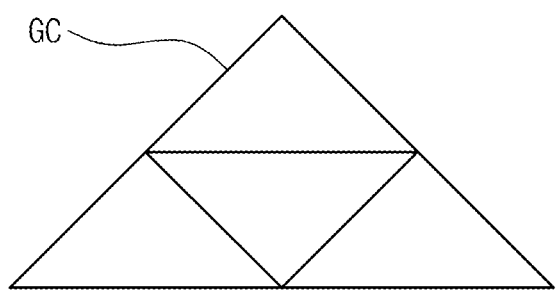
Figure 4:
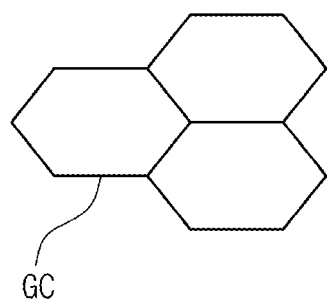

FIG. 1 is a cross-sectional view illustrating an example of a film for a top electrode of an organic light-emitting device according to an embodiment of the inventive concept. FIGS. 2 through 4 are plan views illustrating second electrode parts of the film for a top electrode of the organic light-emitting device according to the embodiment of the inventive concept.

Referring to FIG. 1, a first electrode part 110 may be provided. A voltage may be applied to an organic light-emitting layer of the organic light-emitting device to be described later through the first electrode part 110. The first electrode part 110 may have a plate shape which may be in contact with a top surface of the organic light-emitting layer of the organic light-emitting device. The first electrode part 110 may include a conductive material. For example, the first electrode part 110 may include at least one selected from the group consisting of graphene, a transparent conductive metal oxide, indium tin oxide (ITO), indium zinc oxide (IZO), Al-doped zinc oxide (AZO), Ga-doped zinc oxide (GZO), propylenedioxythiophene, poly(3,4-ethyl enedioxythiophene), and carbon nanotubes. The graphene may have a single layer graphene or multi-layer graphene structure.

A second electrode part 120 may be provided on the first electrode part 110. When viewed from a plan view, the second electrode part 120 may have a grid shape. For example, as illustrated in FIGS. 2 to 4, grid cells GC of the second electrode part 120 may have a rectangular, triangular, or hexagonal shape. A width of each of the grid cells GC of the second electrode part 120 may be in a range of a few tens of micrometers to a few hundreds of micrometers. A thickness of the second electrode part 120 may be in a range of a few hundreds of nanometers to a few thousands of nanometers.

The second electrode part 120 may include a conductive material. For example, the second electrode part 120 may include a metal. For example, the second electrode part 120 may include at least one selected from the group consisting of titanium (Ti), gold (Au), platinum (Pt), silver (Ag), aluminum (Al), copper (Cu), chromium (Cr), nickel (Ni), and molybdenum (Mo). In another example, the second electrode part 120 may include carbon nanotubes, graphite, amorphous carbon, metal particles, metal nanoparticles, metal microparticles, metal nanowires, or a combination thereof. The second electrode part 120 may have a lower resistance than the first electrode part 110. Although not shown in FIG. 1, a conductive polymer may be disposed between the above-described first electrode part 110 and second electrode part 120.

An adhesive layer 130 may be provided on the second electrode part 120. The adhesive layer 130 may cover a surface of the second electrode part 120 except a bottom surface of the second electrode part 120. The adhesive layer 130 may be in contact with the first electrode part 110. The adhesive layer 130, as a semi solid having viscoelasticity, may be deformed by an external force. For example, the adhesive layer 130 may include polydimethylsiloxanes having a plurality of different terminal functional groups. The adhesive layer 130 may include methacryloxypropyl terminated polydimethylsiloxane of Formula 1.

[Formula 1]

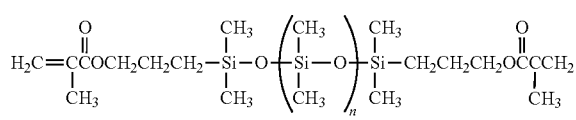

where n includes a natural number, and a weight-average molecular weight is in a range of about 500 to about 100,000.

The adhesive layer 130 may include monomethacryloxypropyl terminated polydimethylsiloxane of Formula 2.

[Formula 2]

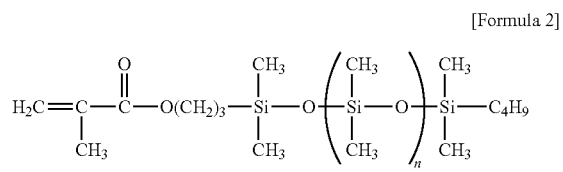

where n includes a natural number, and a weight-average molecular weight is in a range of about 500 to about 100,000.

The adhesive layer 130 may include monocarbinol terminated polydimethylsiloxane of Formula 3.

[Formula 3]

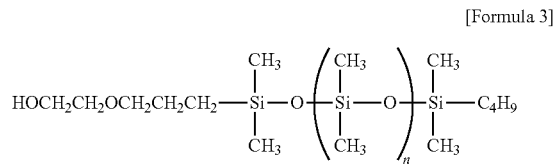

where n includes a natural number, and a weight-average molecular weight is in a range of about 1,000 to about 100,000.

The adhesive layer 130 may include epoxypropoxypropyl terminated polydimethylsiloxane of Formula 4.

[Formula 4]

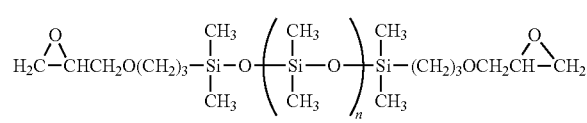

where n includes a natural number, and a weight-average molecular weight is in a range of about 1,000 to about 500,000.

The adhesive layer 130 may include (epoxypropoxypropyl)dimethoxysilyl terminated polydimethylsiloxane of Formula 5.

[Formula 5]

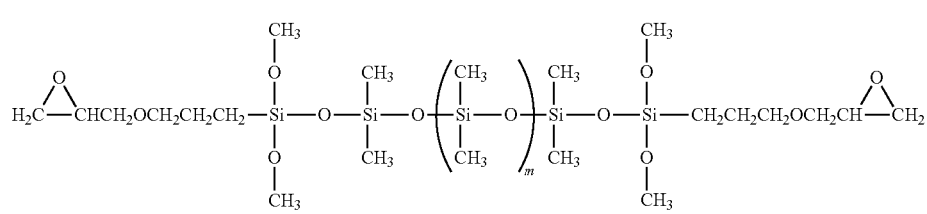

where n includes a natural number, and a weight-average molecular weight is in a range of about 1,000 to about 500,000.

The adhesive layer 130 may include mono-(2,3-epoxy)propylether terminated polydimethylsiloxane of Formula 6.

[Formula 6]

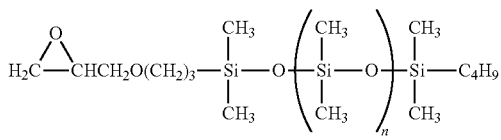

where n includes a natural number, and a weight-average molecular weight is in a range of about 1,000 to about 500,000.

A support layer 140 may be provided on the adhesive layer 130. The support layer 140 may include any one of polyester (PES), polyimide (PI), polyethylene terephthalate (PET), polyethylene naphthalate (PEN), and polydimethylsiloxane (PDMS) films. The support layer 140 may fix the second electrode part 120 and the adhesive layer 130. In the above description, a top electrode of the organic light-emitting device including the first electrode part 110 and the grid-shaped second electrode part 120 may be provided. Since the second electrode part 120 has a lower resistance than the first electrode part 110, sheet resistance of the top electrode of the organic light-emitting device may be reduced.

Figure 5:
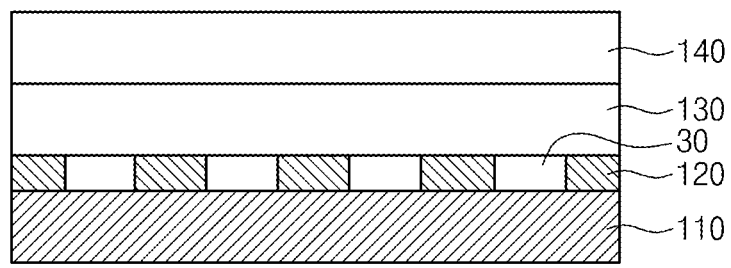
FIG. 5 is a cross-sectional view illustrating another example of the film for a top electrode of the organic light-emitting device according to the embodiment of the inventive concept.

FIG. 5 is a cross-sectional view illustrating another example of the film for a top electrode of the organic light-emitting device according to the embodiment of the inventive concept. Description of substantially the same part as that of the film for a top electrode of the organic light-emitting device described with reference to FIG. 1 will be omitted for the simplicity of the description.

Referring to FIG. 5, a first electrode part 110, a second electrode part 120 on the first electrode part 110, an adhesive layer 130 on the second electrode part 120, and a support layer 140 on the adhesive layer 130 may be provided. The first electrode part 110, the adhesive layer 130, and the support layer 140 may be substantially the same as the film for a top electrode of the organic light-emitting device of FIG. 1. The first electrode part 110 and the adhesive layer 130 may be spaced apart from each other. Accordingly, an air gap 30 may be included in cells of the second electrode part 120. In the above description, a top electrode of the organic light-emitting device including the first electrode part 110 and the grid-shaped second electrode part 120 may be provided. Since the second electrode part 120 has a lower resistance than the first electrode part 110, sheet resistance of the top electrode of the organic light-emitting device may be reduced.

Figure 6:
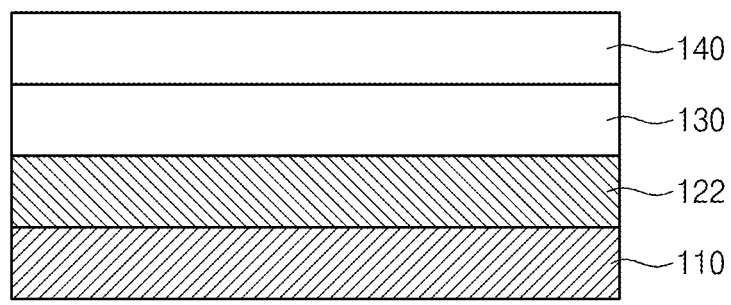
FIG. 6 is a cross-sectional view illustrating another example of the top electrode of the organic light-emitting device according to the embodiment of the inventive concept.

FIG. 6 is a cross-sectional view illustrating another example of the top electrode of the organic light-emitting device according to the embodiment of the inventive concept. Description of substantially the same part as that of the top electrode of the organic light-emitting device described with reference to FIG. 1 will be omitted for the simplicity of the description.

Referring to FIG. 6, a first electrode part 110, a third electrode part 122 on the first electrode part 110, an adhesive layer 130 on the third electrode part 122, and a support layer 140 on the adhesive layer 130 may be provided. The first electrode part 110, the adhesive layer 130, and the support layer 140 may be substantially the same as the first electrode part 110, the adhesive layer 130, and the support layer 140 of the organic light-emitting device of FIG. 1, respectively. The third electrode part 122 may have a plate shape. The third electrode part 122 may include at least one selected from the group consisting of graphene, metal nanoparticles, and metal nanowires. In the above description, a top electrode of the organic light-emitting device including the first electrode part 110 and the grid-shaped third electrode part 122 may be provided. Since the third electrode part 122 has a lower resistance than the first electrode part 110, sheet resistance of the top electrode of the organic light-emitting device may be reduced.

Figure 7:
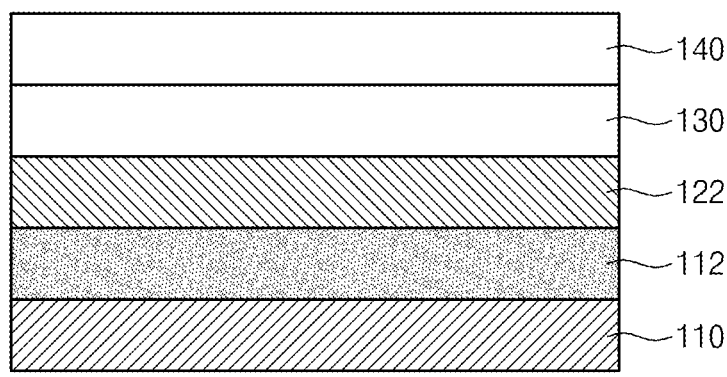
FIG. 7 is a cross-sectional view illustrating another example of the top electrode of the organic light-emitting device according to the embodiment of the inventive concept.

FIG. 7 is a cross-sectional view illustrating another example of the top electrode of the organic light-emitting device according to the embodiment of the inventive concept. Description of substantially the same part as that of the top electrode of the organic light-emitting device described with reference to FIG. 1 will be omitted for the simplicity of the description.

Referring to FIG. 7, a first electrode part 110, a conductive polymer layer 112 on the first electrode part 110, a second electrode part 122 on the conductive polymer layer 112, an adhesive layer 130 on the second electrode part 122, and a support layer 140 on the adhesive layer 130 may be provided. The first electrode part 110, the second electrode part 122, the adhesive layer 130, and the support layer 140 may be substantially the same as the first electrode part 110, the second electrode part 122, the adhesive layer 130, and the support layer 140 of the top electrode of the organic light-emitting device of FIG. 1. Conductivity of the top electrode of the inventive concept may be improved through the conductive polymer layer 112. In a case in which the first electrode part 110 includes graphene, void defects may occur in which carbon bonds in a graphene layer break. In a case in which the conductive polymer layer 112 is coated on the graphene layer, the void defects of the graphene may be reduced. A top electrode of the organic light-emitting device, which has low sheet resistance by including the first electrode part 110, the second electrode part 120, and the conductive polymer layer 112, may be provided.

Hereinafter, methods of manufacturing top electrodes of the organic light-emitting electrode of the inventive concept will be described with reference to the drawings. Although a case is described in which the first electrode part described with reference to FIG. 1, 5, 6, or 7 is graphene, the first electrode part is not limited thereto. In other embodiments not described here, the first electrode part may include at least one selected from the group consisting of a transparent conductive metal oxide, indium tin oxide (ITO), indium zinc oxide (IZO), Al-doped zinc oxide (AZO), Ga-doped zinc oxide (GZO), propylenedioxythiophene, poly(3,4-ethylenedioxythiophene), carbon nanotubes, and a conductive organic material.

Figure 8:
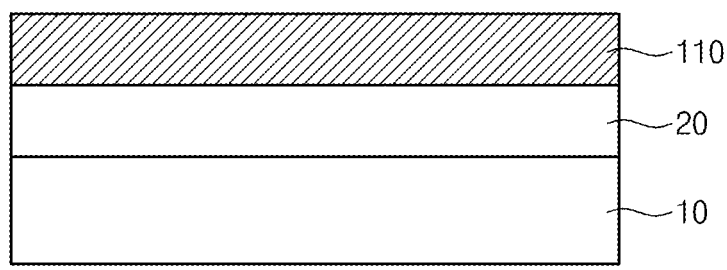
FIGS. 8 through 10 are cross-sectional views for illustrating an example of a method of manufacturing a film for a top electrode of an organic light-emitting device according to an embodiment of the inventive concept.
Figure 9:
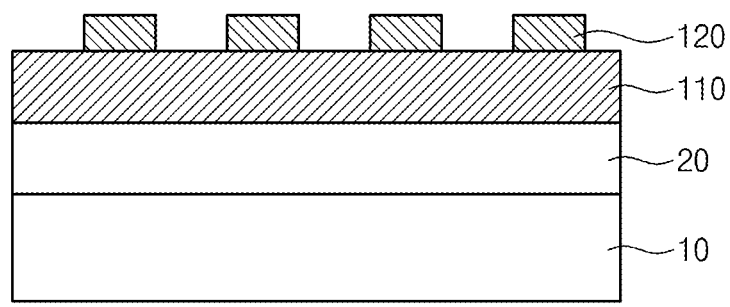
Figure 10:
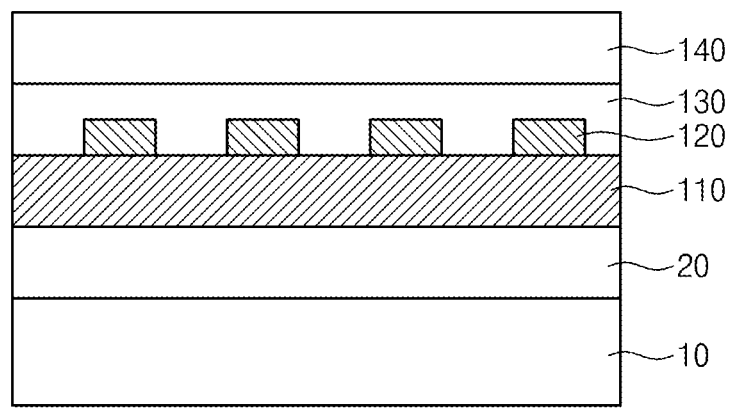

FIGS. 8 through 10 are cross-sectional views for illustrating an example of a method of manufacturing a film for a top electrode of an organic light-emitting device according to an embodiment of the inventive concept. Although a case is described in which the first electrode part of the inventive concept is graphene, the embodiment of the inventive concept is not limited thereto.

Referring to FIG. 8, a catalyst layer 20 may be formed on a substrate 10. For example, the catalyst layer 20 may be deposited on the substrate 10 by chemical vapor deposition (CVD). The catalyst layer 20 may include nickel (Ni) or copper (Cu), but the embodiment of the inventive concept is not limited thereto. The catalyst layer 20 may be used to form graphene in a large area. In a case in which a first electrode part 110, which will be described below, is not graphene, the catalyst layer 20 may be removed.

The graphene layer 110 may be formed on the catalyst layer 20. The graphene layer 110 may be formed in a large area. The graphene layer 110 may have a single layer or multilayer structure. Although the graphene layer 110 may be formed by CVD, the embodiment of the inventive concept is not limited thereto.

Referring to FIG. 9, a second electrode part 120 may be formed on the graphene layer 110. For example, the second electrode part 120 may be formed by patterning a conductive material layer. For example, the conductive material layer may be formed in a large area on the graphene layer 110. The conductive material layer may be formed by CVD, but the embodiment of the inventive concept is not limited thereto. The conductive material layer may be patterned in the form of a grid to form the second electrode part 120. When viewed from a plan view, the grid may have various shapes which have described with reference to FIGS. 2 to 4. In another example, the second electrode part 120 may be formed on the graphene layer 110 by inkjet printing, electrohydrodynamic (EHD) printing, gravure offset printing, gravure printing, reverse offset printing or screen printing. Accordingly, the second electrode part 120 may be directly formed in a grid shape on the graphene layer 110. The second electrode part 120 may include carbon nanotubes, graphite, amorphous carbon, metal particles, metal nanoparticles, metal microparticles, metal nanowires, or a combination thereof. In a case in which the second electrode part 120 is metal, the second electrode part 120 may include at least one selected from the group consisting of titanium (Ti), gold (Au), platinum (Pt), silver (Ag), aluminum (Al), copper (Cu), chromium (Cr), nickel (Ni), and molybdenum (Mo).

Referring to FIG. 10, an adhesive layer 130 may be formed on the second electrode part 120. For example, the adhesive layer 130 may be in contact with the graphene layer 110. In another example, the adhesive layer 130 may be spaced apart from the graphene layer 110. The adhesive layer 130, as a semi solid having viscoelasticity, may be deformed by an external force. The adhesive layer 130 may connect the graphene layer 110 and a support layer 140 to be described later. The support layer 140 may be formed on the adhesive layer 130. The support layer 140 may include any one of polyester (PES), polyimide (PI), polyethylene terephthalate (PET), polyethylene naphthalate (PEN), and polydimethylsiloxane (PDMS) films. The support layer 140 may prevent deformation of the second electrode part 120 and the adhesive layer 130 by fixing the second electrode part 120 and the adhesive layer 130.

Referring again to FIG. 1 or 5, a film for a top electrode of the organic light-emitting device may be formed by removing the catalyst layer 20 and the substrate 10. The catalyst layer 20 may be removed through an etching process using an etching solution, but the embodiment of the inventive concept is not limited thereto. The substrate 10 may be removed by the removal of the catalyst layer 20.

Figure 11:
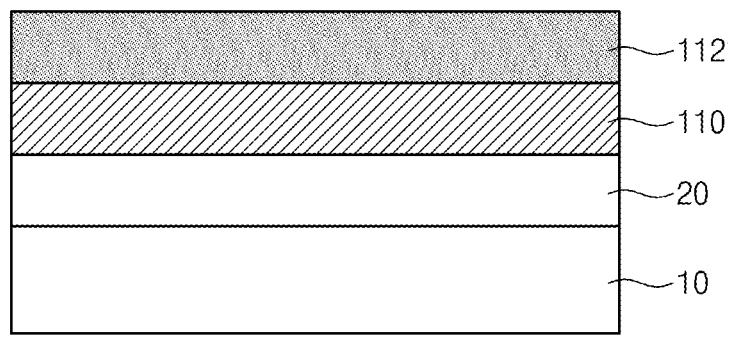
FIGS. 11 through 13 are cross-sectional views for illustrating another example of the method of manufacturing a film for a top electrode of an organic light-emitting device according to the embodiment of the inventive concept.
Figure 12:
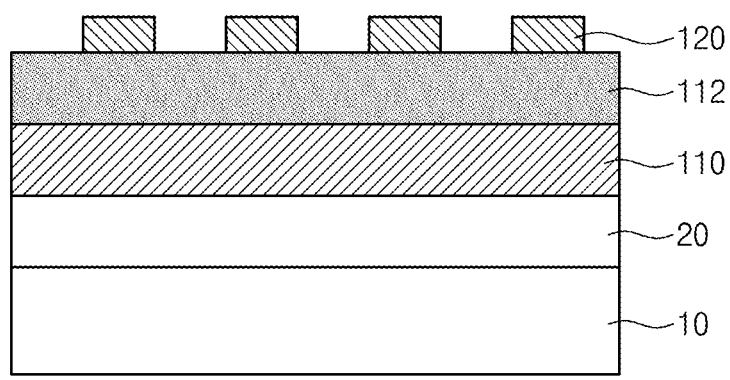
Figure 13:
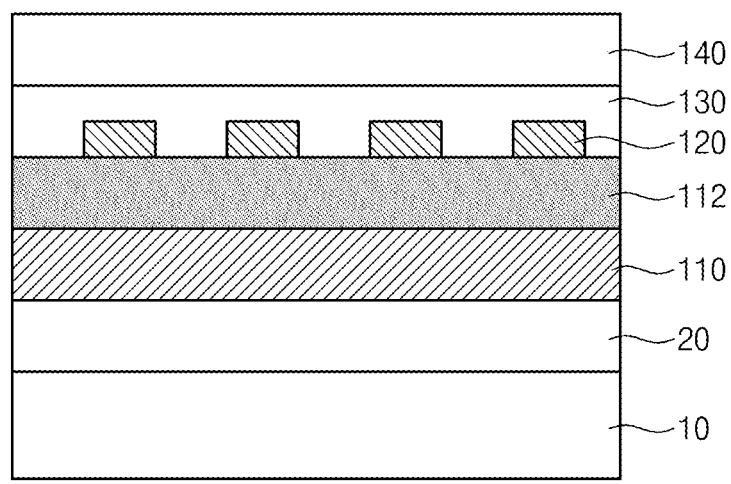

FIGS. 11 through 13 are cross-sectional views for illustrating another example of the method of manufacturing a film for a top electrode of an organic light-emitting device according to the embodiment of the inventive concept. Description of substantially the same process as that of the top electrode of the organic light-emitting device described with reference to FIGS. 8 to 10 will be omitted for the simplicity of the description.

Referring to FIG. 11, a conductive polymer layer 112 may be formed on a graphene layer 110. A process of forming the conductive polymer layer 112 may include deposition or printing, but the embodiment of the inventive concept is not limited thereto. For example, the conductive polymer layer 112 may be formed on the graphene layer 110 by CVD. The graphene layer 110 may include void defects in which carbon bonds in the graphene layer 110 break. In a case in which the conductive polymer layer 112 is coated on the graphene layer 110, the void defects of the graphene layer 110 may be reduced. The conductive polymer layer 112 may improve the conductivity of the top electrode.

Referring to FIG. 12, a second electrode part 120 may be formed on the conductive polymer layer 112. A process of forming the second electrode part 120 may be substantially the same as the process of forming the second electrode part 120 described with reference to FIG. 9. In the present example, although the second electrode part 120 has a grid shape, the embodiment of the inventive concept is not limited thereto. That is, in another example, the second electrode part 120 may be formed in a large area on the conductive polymer layer 112.

Referring to FIG. 13, an adhesive layer 130 and a support layer 140 on the adhesive layer 130 may be formed on the second electrode part 120. A process of forming the adhesive layer 130 and the support layer 140 may be substantially the same as the process of forming the adhesive layer 130 and the support layer 140 described with reference to FIG. 10. The adhesive layer 130, as a semi solid having viscoelasticity, may be deformed by an external force. The adhesive layer 130 may connect the support layer 140 and the graphene layer 110. The support layer 140 may include any one of PES, PI, PET, PEN, and PDMS films. The support layer 140 may prevent deformation of the second electrode part 120 and the adhesive layer 130 by fixing the second electrode part 120 and the adhesive layer 130.

Referring again to FIG. 7, a film for a top electrode of the organic light-emitting device may be formed by removing a catalyst layer 20 and a substrate 10. The catalyst layer 20 may be removed through an etching process using an etching solution, but the embodiment of the inventive concept is not limited thereto. The substrate 10 may be removed by the removal of the catalyst layer 20.

FIGS. 14 through 18 are cross-sectional views for illustrating another example of the method of manufacturing a film for a top electrode of an organic light-emitting device according to the embodiment of the inventive concept. Description of substantially the same process as that of the examples described with reference to FIGS. 8 to 10 will be omitted for the simplicity of the description.

Figure 14:
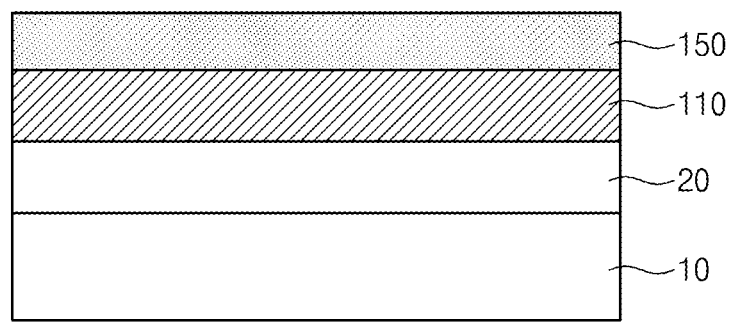
FIGS. 14 through 18 are cross-sectional views for illustrating another example of the method of manufacturing a film for a top electrode of an organic light-emitting device according to the embodiment of the inventive concept.

Referring to FIG. 14, a photoresist layer 150 may be formed on a graphene layer 110. For example, the photoresist layer 150 may be formed on the graphene layer 110 through a coating process, but the embodiment of the inventive concept is not limited thereto.

Figure 15:
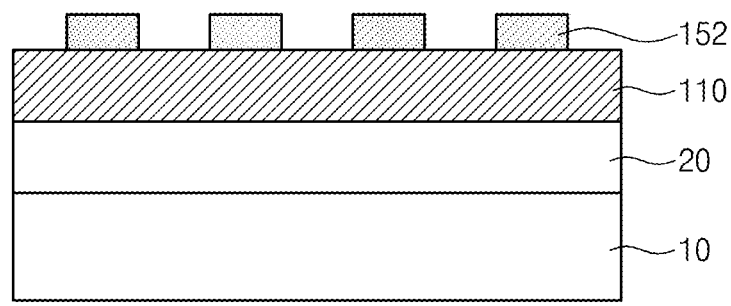

Referring to FIG. 15, a photoresist pattern 152 may be formed by patterning the photoresist layer 150. The photoresist layer 150 may be patterned to expose a top surface of the graphene layer 110 in the form of a grid. The formation of a second electrode part 120 to be described later at an unwanted portion may be prevented by using the photoresist pattern 152.

Figure 16:
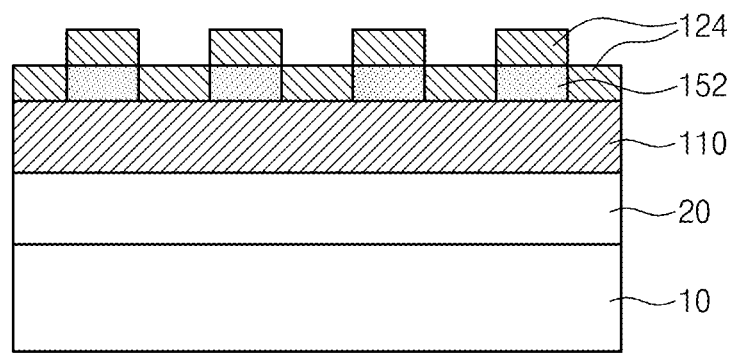

Referring to FIG. 16, a conductive material layer 124 may be formed on the graphene layer 110. For example, the conductive material layer 124 may be formed on the graphene layer 110 by CVD. The conductive material layer 124 may include carbon nanotubes, graphite, amorphous carbon, metal particles, metal nanoparticles, metal microparticles, or a combination thereof. In a case in which the conductive material layer 124 includes a metal, the conductive material layer 124 may include at least one selected from the group consisting of Ti, Au, Pt, Ag, Al, Cu, Cr, Ni, and Mo.

Figure 17:
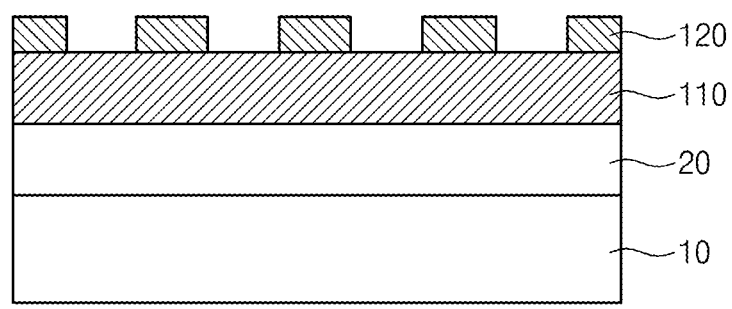

Referring to FIG. 17, the photoresist pattern 152 may be lifted off. Accordingly, a grid-shaped second electrode part 120 may be formed on the graphene layer 110. The second electrode part 120 may include the same material as the conductive material layer 124.

Figure 18:
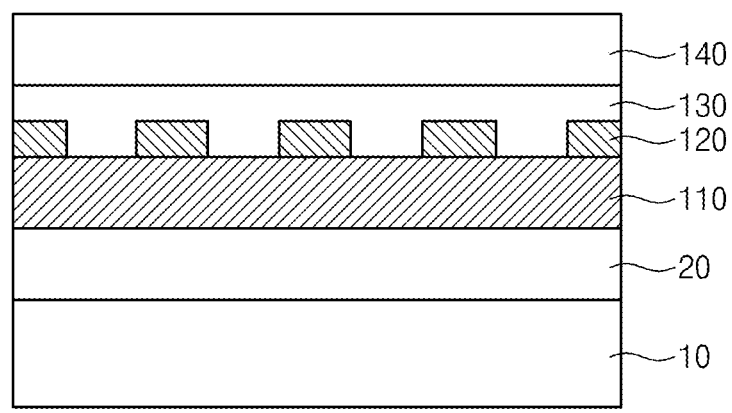

Referring to FIG. 18, an adhesive layer 130 and a support layer 140 on the adhesive layer 130 may be formed on the second electrode part 120. A process of forming the adhesive layer 130 and the support layer 140 may be substantially the same as the process of forming the adhesive layer 130 and the support layer 140 described with reference to FIG. 10. The adhesive layer 130, as a semi solid having viscoelasticity, may be deformed by an external force. The adhesive layer 130 may connect the support layer 140 and the graphene layer 110. The support layer 140 may include any one of PES, PI, PET, PEN, and PDMS films. The support layer 140 may prevent deformation of the second electrode part 120 and the adhesive layer 130 by fixing the second electrode part 120 and the adhesive layer 130.

Referring again to FIG. 1 or 5, a film for a top electrode of the organic light-emitting device may be formed by removing a catalyst layer 20. The catalyst layer 20 may be removed through an etching process using an etching solution, but the embodiment of the inventive concept is not limited thereto.

FIGS. 19 through 22 are cross-sectional views for illustrating another example of the method of manufacturing a film for a top electrode of an organic light-emitting device according to the embodiment of the inventive concept. Description of substantially the same process as that of the examples described with reference to FIGS. 14 to 18 will be omitted for the simplicity of the description.

Figure 19:
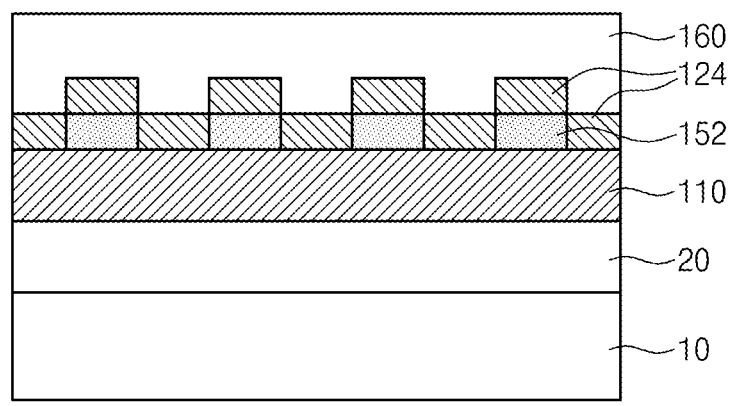
FIGS. 19 through 22 are cross-sectional views for illustrating another example of the method of manufacturing a film for a top electrode of an organic light-emitting device according to the embodiment of the inventive concept.

Referring to FIG. 19, a protective layer 160 may be formed on a conductive material layer 124. The conductive material layer 124 may be substantially the same as the conductive material layer 124 described with reference to FIG. 16. For example, the protective layer 160 may be formed on the conductive material layer 124 through a coating process. The protective layer 160 may include a material having different etching characteristics from a photoresist pattern 152 (for example, a photoresist material different from the photoresist pattern 152).

Figure 20:
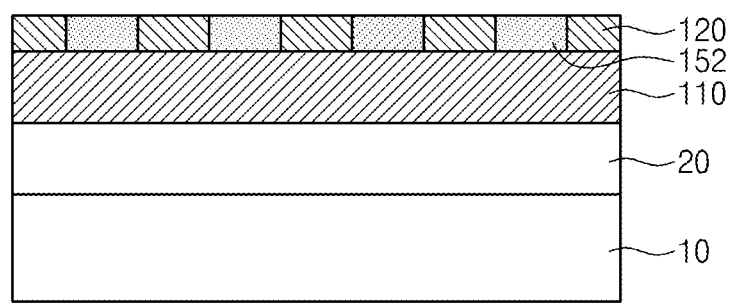

Referring to FIG. 20, top surfaces of a second electrode part 120 and the photoresist pattern 152 may be exposed by removing the protective layer 160 and the conductive material layer 124. For example, the protective layer 160 and the conductive material layer 124 may be removed by an etching process or a planarization process (e.g., chemical mechanical polishing). For example, a top surface of the conductive material layer 124 in contact with the top surface of the photoresist pattern 152 may be exposed by etching a portion of the protective layer 160. The conductive material layer 124 may be etched to expose the top surface of the photoresist pattern 152. The entire protective layer 160 may be etched. In a case in which the protective layer 160 and the conductive material layer 124 are removed through the planarization process, heights of the top surfaces of the photoresist pattern 152 and the second electrode part 120 may be the same.

Figure 21:
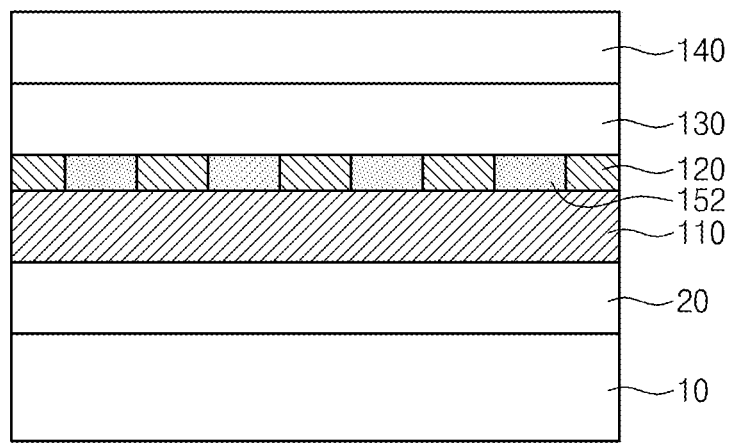

Referring to FIG. 21, an adhesive layer 130 on the second electrode part 120 and a support layer 140 on the adhesive layer 130 may be formed. A process of forming the adhesive layer 130 and the support layer 140 may be substantially the same as the process of forming the adhesive layer 130 and the support layer 140 described with reference to FIG. 10. The adhesive layer 130, as a semi solid having viscoelasticity, may be deformed by an external force. The adhesive layer 130 may connect the support layer 140 and the graphene layer 110. The support layer 140 may include any one of PES, PI, PET, PEN, and PDMS films. The support layer 140 may prevent deformation of the second electrode part 120 and the adhesive layer 130 by fixing the second electrode part 120 and the adhesive layer 130.

Figure 22:
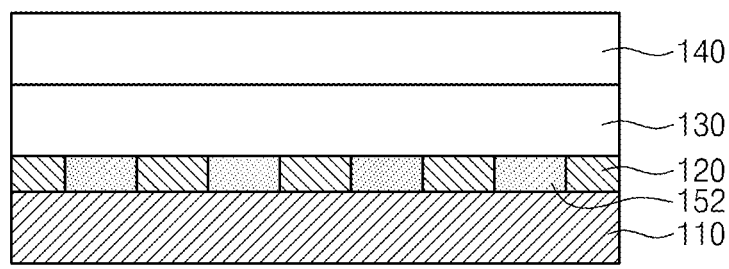

Referring to FIG. 22, a film for a top electrode of the organic light-emitting device may be formed by removing a catalyst layer 20 and a substrate 10. The catalyst layer 20 may be removed through an etching process using an etching solution, but the embodiment of the inventive concept is not limited thereto. The substrate 10 may be removed by the removal of the catalyst layer 20.

Figure 23:
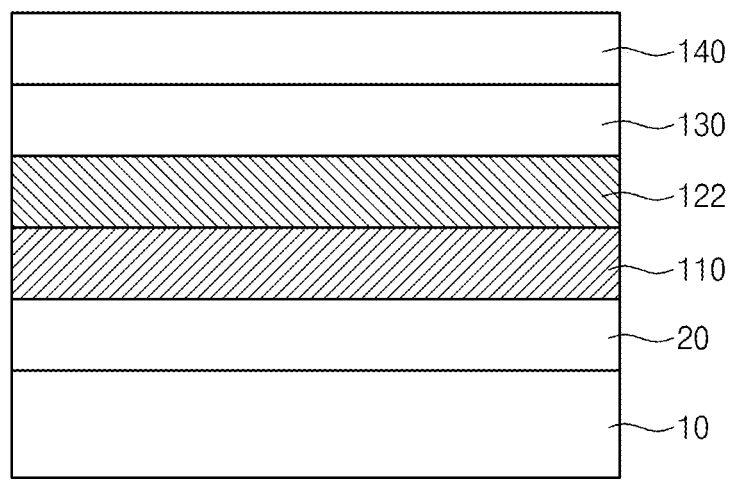
FIG. 23 is a cross-sectional view for illustrating another example of the method of manufacturing a film for a top electrode of an organic light-emitting device according to the embodiment of the inventive concept.

FIG. 23 is a cross-sectional view for illustrating another example of the method of manufacturing a film for a top electrode of an organic light-emitting device according to the embodiment of the inventive concept. Description of substantially the same process as that of the examples described with reference to FIGS. 8 to 10 will be omitted for the simplicity of the description.

Referring to FIG. 23, a catalyst layer 20, a graphene layer 110, a third electrode part 122, an adhesive layer 130, and a support layer 140 may be formed on a substrate 10. A process of forming the catalyst layer 20, the graphene layer 110, the adhesive layer 130, and the support layer 140 may be substantially the same as the process of forming the catalyst layer 20, the graphene layer 110, the adhesive layer 130, and the support layer 140 described with reference to FIG. 8. The third electrode part 122 may be formed on the graphene layer 110. The third electrode part 122 may include a conductive material. For example, the third electrode part 122 may include at least one selected from the group consisting of graphene, metal nanoparticles, and metal nanowires, but the embodiment of the inventive concept is not limited thereto. The third electrode part 122 may be formed on the graphene layer 110 through a coating process.

Referring again to FIG. 6, a film for a top electrode of the organic light-emitting device may be formed by removing the catalyst layer 20 and the substrate 10. The catalyst layer 20 may be removed through an etching process using an etching solution, but the embodiment of the inventive concept is not limited thereto. The substrate 10 may be removed by the removal of the catalyst layer 20.

Figure 24:
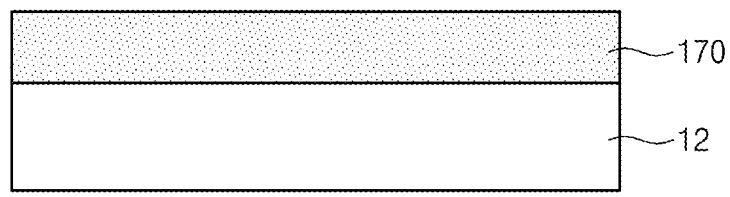
FIGS. 24 through 26 are cross-sectional views for illustrating another example of the method of manufacturing a film for a top electrode of an organic light-emitting device according to the embodiment of the inventive concept.
Figure 25:
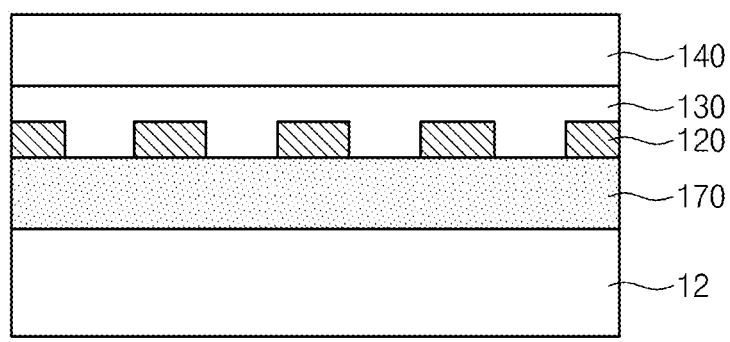
Figure 26:
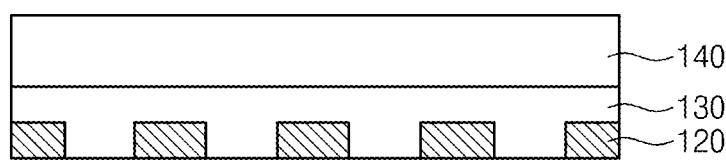

FIGS. 24 through 26 are cross-sectional views for illustrating another example of the method of manufacturing a film for a top electrode of an organic light-emitting device according to the embodiment of the inventive concept. Description of substantially the same process as that of the examples described with reference to FIGS. 8 to 10, FIGS. 14 to 18, FIGS. 19 to 22, or FIG. 23 will be omitted for the simplicity of the description.

Referring to FIG. 24, a self-assembled monolayer (SAM) 170 may be formed on a first substrate 12. The self-assembled monolayer 170 may facilitate the separation of the first substrate 12 and a second electrode part 120 (or third electrode part 122) to be described later. The self-assembled monolayer 170 may be formed by a reaction of a hydroxy group (—OH) with a self-assembled single molecular material. Hereinafter, a process of forming the self-assembled monolayer 170 will be described.

Liquid acetone, methanol, and deionized water are sequentially provided to the first substrate 12. The first substrate 12 may be treated with ultraviolet light in an ozone atmosphere. Accordingly, a hydroxy group (—OH) may be formed on the first substrate 12. A self-assembled single molecular material may be provided on the first substrate 12. The self-assembled single molecular material may include trichloro(1H, 1H, 2H, 2H-heptadecafluorodecyl)silane. For example, the self-assembled single molecular material may be coated on the first substrate 12. The hydroxy group (—OH) and the self-assembled single molecular material may be subjected to a condensation reaction to form the self-assembled monolayer 170. The first substrate 12 may be washed and dried. A washing process of the first substrate 12 may be performed using at least one selected from the group consisting of acetone, toluene, methanol, and deionized water. The first substrate 12 may be dried at a temperature of about 100° C. to about 130° C. and a pressure of about $10^{-2}$ torr. A drying process of the first substrate 12 may be maintained for about 1 hour.

The self-assembled monolayer 170 may be refined. For example, acetone, toluene, methanol, and water solvents may be sequentially provided to the self-assembled monolayer 170. The self-assembled monolayer 170 may be dried for about 1 hour at a temperature of about 100° C. and a pressure of about $10^{-2}$ torr. The self-assembled monolayer 170 may have a surface roughness of about 1 nm or less.

Referring to FIG. 25, the second electrode part 120, an adhesive layer 130 on the second electrode part 120, and a support layer 140 on the adhesive layer 130 may be formed on the self-assembled monolayer 170. A process of forming the second electrode part 120, the adhesive layer 130, and the support layer 140 may be substantially the same as the process of forming the second electrode part 120, the adhesive layer 130, and the support layer 140 described with reference to FIGS. 8 to 10, FIGS. 14 to 18, or FIGS. 19 to 24. Although a case is illustrated in which the second electrode part 120 is a grid shape, the second electrode part 120 may be substantially the same as the third electrode part of FIG. 23. The process of forming the second electrode part 120 may be substantially the same as the process of forming the third electrode part 122 described with reference to FIG. 23.

Referring to FIG. 26, the self-assembled monolayer 170 and the first substrate 12 may be removed to expose a bottom surface of the adhesive layer 130. The self-assembled monolayer 170 may be removed by a physical force. For example, the bottom surface of the adhesive layer 130 may have a surface roughness of about 1 nm or less. The first substrate 12 may be removed by the removal of the self-assembled monolayer 170.

Referring again to FIG. 10, 13, 18, or 21, a bottom surface of the second electrode part 120 and a top surface of the graphene layer 110 may be bonded to each other. Accordingly, the catalyst layer 20, the first electrode part (e.g., graphene layer) 110, the second electrode part 120, the adhesive layer 130, and the support layer 140 may be sequentially provided in a layered structure on the substrate 10.

Referring again to FIG. 1, 5, 6, 7, or 22, a film for a top electrode of the organic light-emitting device may be formed by removing the catalyst layer 20 and the substrate 10. The catalyst layer 20 may be removed through an etching process using an etching solution, but the embodiment of the inventive concept is not limited thereto. The substrate 10 may be removed by the removal of the catalyst layer 20.

FIGS. 27 through 30 are cross-sectional views for illustrating another example of the method of manufacturing a film for a top electrode of an organic light-emitting device according to the embodiment of the inventive concept. Description of substantially the same process as that of the examples described with reference to FIGS. 8 to 10, FIGS. 14 to 18, FIGS. 19 to 22, FIG. 23, or FIGS. 24 to 26 will be omitted for the simplicity of the description.

Figure 27:
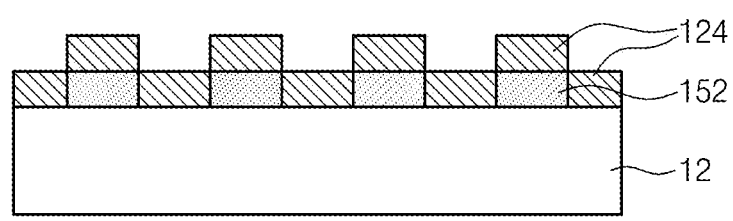
FIGS. 27 through 30 are cross-sectional views for illustrating another example of the method of manufacturing a film for a top electrode of an organic light-emitting device according to the embodiment of the inventive concept.

Referring to FIG. 27, a photoresist pattern 152 may be formed on a first substrate 12. The photoresist pattern 152 may be formed by substantially the same process as the process of forming the photoresist pattern 152 described with reference to FIGS. 14 and 15. A conductive material layer 124 may be formed on the first substrate 12. Although not shown in FIG. 27, a self-assembled monolayer (SAM), for example, may be disposed between the conductive material layer 124 and the first substrate 12. The first substrate 12 and a second electrode part to be described later may be effectively separated by the disposition of the SAM. In another example, a plasma surface treatment process may be provided to a top surface of the first substrate 12 in contact with the conductive material layer 124. For example, the top surface of the first substrate 12 may be subjected to a plasma treatment using nitrogen, oxygen, argon, and/or $CF_x$ gas. The energy of the surface of the first substrate 12 may be changed by the plasma treatment process, and the surface of the first substrate 12 may be hydrophobic or hydrophilic. Substantially the same effect as that of the disposition of the SAM between the conductive material layer 124 and the first substrate 12 may be obtained by the plasma treatment process.

Figure 28:
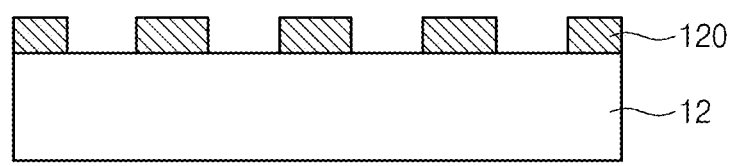

Referring to FIG. 28, the photoresist pattern 152 may be lifted off to form a second electrode part 120. The second electrode part 120 may have a grid shape. The second electrode part 120 may include carbon nanotubes, graphite, amorphous carbon, metal particles, metal nanoparticles, metal microparticles, metal nanowires, or a combination thereof. In a case in which the second electrode part 120 is metal, the second electrode part 120 may include at least one selected from the group consisting of Ti, Au, Pt, Ag, Al, Cu, Cr, Ni, and Mo.

Figure 29:
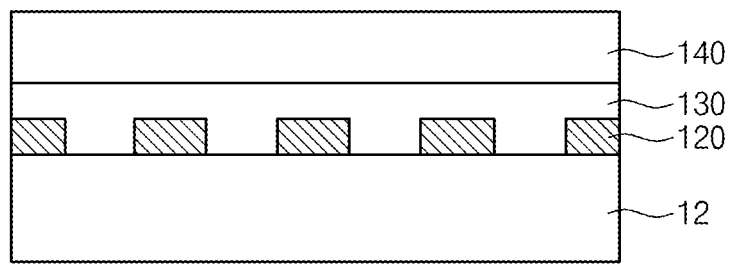

Referring to FIG. 29, an adhesive layer 130 and a support layer 140 on the adhesive layer 130 may be formed on the second electrode part 120. A process of forming the adhesive layer 130 and the support layer 140 may be substantially the same as the process of forming the adhesive layer 130 and the support layer 140 described with reference to FIGS. 24 to 26. The adhesive layer 130 may cover surfaces except a bottom surface of the second electrode part 120.

Figure 30:
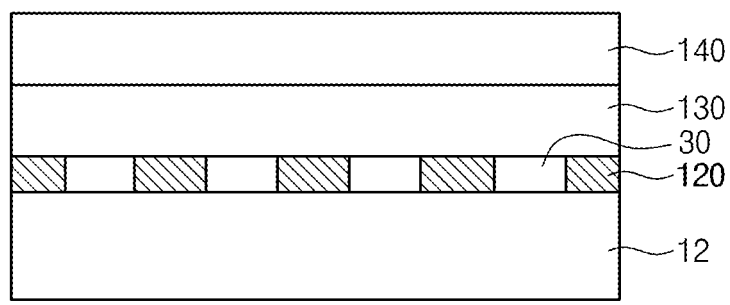

Referring to FIG. 30, an adhesive layer 130 and a support layer 140 on the adhesive layer 130 may be formed on the second electrode part 120. A process of forming the adhesive layer 130 and the support layer 140 may be substantially the same as the process of forming the adhesive layer 130 and the support layer 140 described with reference to FIGS. 24 to 26. However, the adhesive layer 130 may be spaced apart from the first substrate 12. Also, an air gap 30 may be disposed between the second electrode parts 120.

Referring again to FIG. 26, the first substrate 12 may be removed to expose bottom surfaces of the adhesive layer 130 and the second electrode part 120. The first substrate 12 may be removed by a physical force in a direction away from the adhesive layer 130. For example, a self-assembled monolayer (SAM, not shown) may be formed between the first substrate 12 and the second electrode part 120. Adhesion between the SAM and the second electrode part 120 may be lower than adhesion between the SAM and the first substrate 12. Accordingly, in a case in which the first substrate 12 is subjected to a force in the direction away from the adhesive layer 130, the SAM and the adhesive layer 130 may be separated. The first substrate 12 may be separated from the adhesive layer 130 due to the separation of the SAM. In another embodiment, a top surface of the first substrate 12 may be subjected to a plasma surface treatment. The plasma surface treatment may control surface characteristics of the first substrate 12 to be hydrophilic or hydrophobic. The surface characteristics of the first substrate 12 may be selected to allow the adhesive layer 130 and the second electrode part 120 to be easily separated from the first substrate 12. Accordingly, the first substrate 12 and the second electrode part 120 and the substrate 12 and the adhesive layer 130 may be separated by a force in a direction away from each other.

Referring again to FIG. 10, 13, 18, or 21, a bottom surface of the second electrode part 120 and a top surface of the graphene layer 110 may be bonded to each other. Accordingly, the catalyst layer 20, the first electrode part (e.g., graphene layer) 110, the second electrode part 120, the adhesive layer 130, and the support layer 140 may be sequentially provided in a layered structure on the substrate 10.

Referring again to FIG. 1, 5, 6, 7, or 22, a film for a top electrode of the organic light-emitting device may be formed by removing the catalyst layer 20 and the substrate 10. The catalyst layer 20 may be removed through an etching process using an etching solution, but the embodiment of the inventive concept is not limited thereto. The substrate 10 may be removed by the removal of the catalyst layer 20.

Hereinafter, an organic light-emitting device will be described with reference to the drawings.

FIGS. 31 through 34 are cross-sectional views illustrating examples of an organic light-emitting device according to another embodiment of the inventive concept. Description of substantially the same part as that of the film for a top electrode of the organic light-emitting device and the method of manufacturing the same, which have been described with reference to FIGS. 1 to 30, will be omitted for the simplicity of the description. Although a case is described in which the first electrode part described with reference to FIGS. 1 to 7 is graphene, the embodiment of the inventive concept is not limited thereto. In other embodiments not described here, the first electrode part may include at least one selected from the group consisting of a transparent conductive metal oxide, indium tin oxide (ITO), indium zinc oxide (IZO), Al-doped zinc oxide (AZO), Ga-doped zinc oxide (GZO), propylenedioxythiophene, poly(3,4-ethyl enedioxythiophene), and carbon nanotubes. Although not shown in the drawings, a conductive polymer may be disposed between a graphene layer 110 and an auxiliary electrode part which will be described later.

Figure 31:
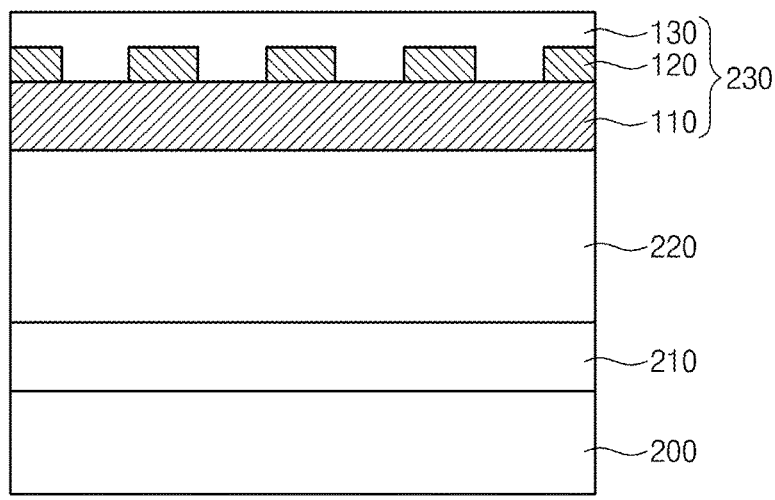
FIGS. 31 through 34 are cross-sectional views illustrating examples of an organic light-emitting device according to another embodiment of the inventive concept.

Referring to FIG. 31, a bottom electrode 210 may be formed on a substrate 200. For example, the bottom electrode 210 may be deposited on the substrate 200 through a chemical vapor deposition (CVD) process, but the embodiment of the inventive concept is not limited thereto. The bottom electrode 210 may include a conductive material. An organic light-emitting layer 220 may be formed on the bottom electrode 210. For example, the organic light-emitting layer 220 may be formed on the bottom electrode 210 through a CVD process, but the embodiment of the inventive concept is not limited thereto. The organic light-emitting layer 220 may emit light by a voltage applied between the bottom electrode 210 and a top electrode 230.

The top electrode 230 may be transferred on the organic light-emitting layer 220. The top electrode 230 may include the graphene layer 110, an auxiliary electrode part 120 on the graphene layer 110, and an adhesive layer 130 on the auxiliary electrode part 120. The graphene layer 110, the auxiliary electrode part 120, and the adhesive layer 130 may be substantially the same as the first electrode part 110, the second electrode part 120, and the adhesive layer 130 of the film for the top electrode 230 which have been described with reference to FIG. 1, respectively.

Hereinafter, a transfer process of the top electrode 230 will be described. A top surface of the organic light-emitting layer 220 and a bottom surface of the graphene layer 110 of the film for the top electrode 230 described with reference FIG. 1 may be bonded to each other. The support layer 140 may be removed. A process of manufacturing a film for the top electrode 230 may be substantially the same as the process of manufacturing the film for the top electrode 230 described with reference to FIGS. 8 to 10, FIGS. 24 to 26, or FIGS. 27 to 30.

Figure 32:
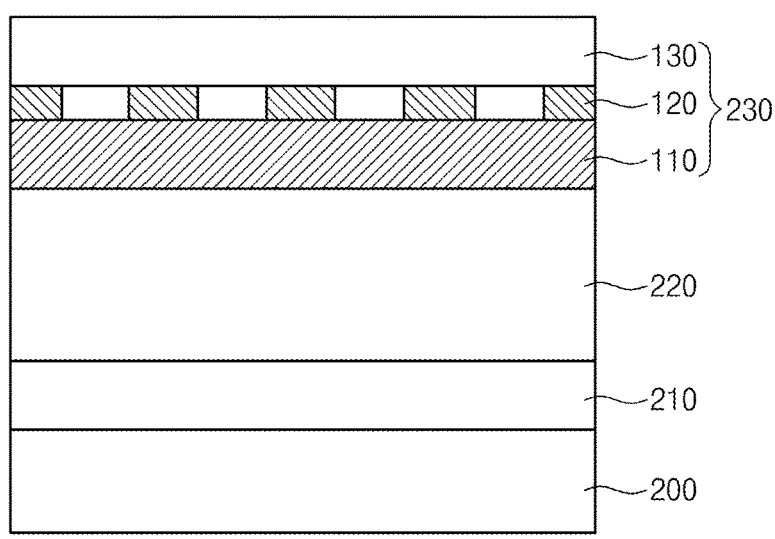

Referring to FIG. 32, a bottom electrode 210 may be formed on a substrate 200. For example, the bottom electrode 210 may be deposited on the substrate 200 through a CVD process, but the embodiment of the inventive concept is not limited thereto. The bottom electrode 210 may include a conductive material. An organic light-emitting layer 220 may be formed on the bottom electrode 210. For example, the organic light-emitting layer 220 may be formed on the bottom electrode 210 through a CVD process, but the embodiment of the inventive concept is not limited thereto. The organic light-emitting layer 220 may emit light by a voltage applied between the bottom electrode 210 and a top electrode 230.

The top electrode 230 may be transferred on the organic light-emitting layer 220. The top electrode 230 may include a graphene layer 110, an auxiliary electrode part 120 on the graphene layer 110, and an adhesive layer 130 on the auxiliary electrode part 120. The graphene layer 110, the auxiliary electrode part 120, and the adhesive layer 130 may be substantially the same as the first electrode part 110, the second electrode part 120, and the adhesive layer 130 of the film for the top electrode 230 described with reference to FIG. 5, respectively.

Hereinafter, a transfer process of the top electrode 230 will be described. A top surface of the organic light-emitting layer 220 and a bottom surface of the graphene layer 110 of the film for the top electrode 230 described with reference FIG. 5 may be bonded to each other. The support layer 140 may be removed. A process of manufacturing a film for the top electrode 230 may be substantially the same as the process of manufacturing the film for the top electrode 230 described with reference to FIGS. 8 to 10, FIGS. 24 to 26, or FIGS. 27 to 30.

Figure 33:
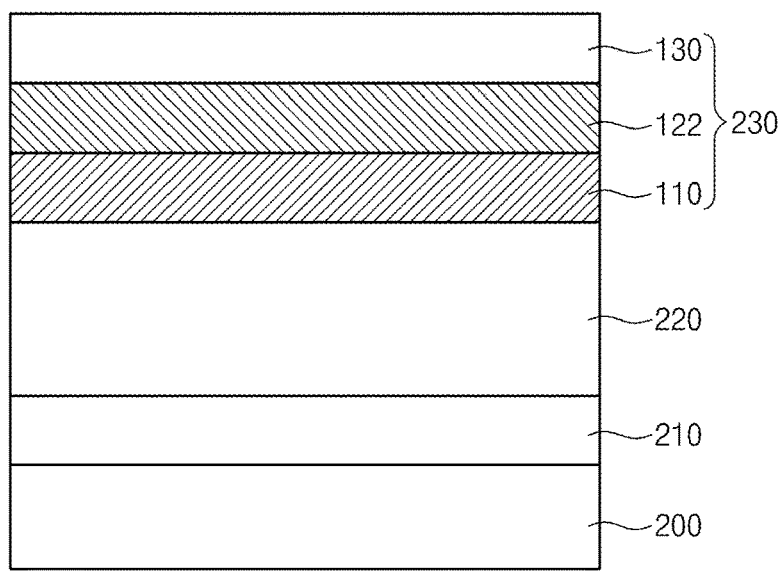

Referring to FIG. 33, a bottom electrode 210 may be formed on a substrate 200. For example, the bottom electrode 210 may be deposited on the substrate 200 through a CVD process, but the embodiment of the inventive concept is not limited thereto. The bottom electrode 210 may include a conductive material. An organic light-emitting layer 220 may be formed on the bottom electrode 210. For example, the organic light-emitting layer 220 may be formed on the bottom electrode 210 through a CVD process, but the embodiment of the inventive concept is not limited thereto. The organic light-emitting layer 220 may emit light by a voltage applied between the bottom electrode 210 and a top electrode 230.

The top electrode 230 may be transferred on the organic light-emitting layer 220. The top electrode 230 may include a graphene layer 110, an auxiliary electrode part 120 on the graphene layer 110, and an adhesive layer 130 on the auxiliary electrode part 120. The graphene layer 110, the auxiliary electrode part 120, and the adhesive layer 130 may be substantially the same as the first electrode part 110, the third electrode part 122, and the adhesive layer 130 of the film for the top electrode 230 described with reference to FIG. 6, respectively.

Hereinafter, a transfer process of the top electrode 230 will be described. A top surface of the organic light-emitting layer 220 and a bottom surface of the graphene layer 110 of the film for the top electrode 230 described with reference FIG. 6 may be bonded to each other. The support layer 140 may be removed. A process of manufacturing a film for the top electrode 230 may be substantially the same as the process of manufacturing the film for the top electrode 230 described with reference to FIG. 23 or FIGS. 24 to 26.

Figure 34:
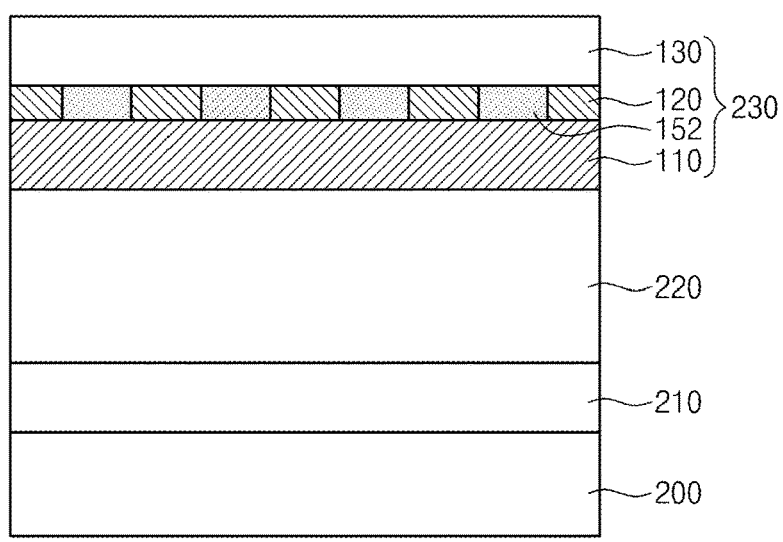

Referring to FIG. 34, a bottom electrode 210 may be formed on a substrate 200. For example, the bottom electrode 210 may be deposited on the substrate 200 through a CVD process, but the embodiment of the inventive concept is not limited thereto. The bottom electrode 210 may include a conductive material. An organic light-emitting layer 220 may be formed on the bottom electrode 210. For example, the organic light-emitting layer 220 may be formed on the bottom electrode 210 through a CVD process, but the embodiment of the inventive concept is not limited thereto. The organic light-emitting layer 220 may emit light by a voltage applied between the bottom electrode 210 and a top electrode 230.

The top electrode 230 may be transferred on the organic light-emitting layer 220. The top electrode 230 may include a graphene layer 110, an auxiliary electrode part 120 and a photoresist pattern 152 on the graphene layer 110, and an adhesive layer 130 on the auxiliary electrode part 120. The graphene layer 110, the auxiliary electrode part 120, the photoresist pattern 152, and the adhesive layer 130 may be substantially the same as the first electrode part 110, the second electrode part 120, the photoresist pattern 152, and the adhesive layer 130 of the film for the top electrode 230 described with reference to FIG. 22, respectively.

Hereinafter, a transfer process of the top electrode 230 will be described. A top surface of the organic light-emitting layer 220 and a bottom surface of the graphene layer 110 of the film for the top electrode 230 described with reference FIG. 22 may be bonded to each other. The support layer 140 may be removed. A process of manufacturing a film for the top electrode 230 may be substantially the same as the process of manufacturing the film for the top electrode 230 described with reference to FIGS. 14 to 22 or FIGS. 24 to 26.

According to the inventive concept, an organic light-emitting device, which has a top electrode having low sheet resistance, may be provided.

However, the effects of the inventive concept are not limited to the above-described effects.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. Accordingly, the exemplary embodiments should be considered in descriptive sense only and not for purposes of limitation. Therefore, the scope of the invention is defined not by the detailed description of the invention but by the appended claims, and all differences within the scope will be construed as being included in the present invention.

What is claimed is:

1. A method of manufacturing an organic light-emitting device, the method comprising:
   providing a substrate;
   forming a bottom electrode on the substrate;
   forming an organic light-emitting layer on the bottom electrode; and
   transferring a top electrode on the organic light-emitting layer,
   wherein the transferring of the top electrode comprises:
      providing a graphene layer;
      transferring an auxiliary electrode film on the graphene layer; and
      bonding a top surface of the organic light-emitting layer and a bottom surface of the graphene layer, and
   wherein the transferring of the auxiliary electrode film comprises:
      providing a self-assembled monolayer;
      forming an auxiliary electrode part on the self-assembled monolayer; and
      removing the self-assembled monolayer.

2. The method of claim 1, wherein the auxiliary electrode part is a grid-shaped electrode part or a plate-shaped auxiliary electrode part, and
   wherein the transferring of the auxiliary electrode film further comprises:
   forming an adhesive layer on the auxiliary electrode part;
   forming a support layer on the adhesive layer; and
   bonding a bottom surface of the auxiliary electrode part and a top surface of the graphene layer.

3. The method of claim 2, wherein the forming of the grid-shaped auxiliary electrode part comprises:
   forming a photoresist layer on the self-assembled monolayer;
   forming a photoresist pattern by etching the photoresist layer;
   forming a conductive material layer on the graphene layer; and
   lifting off the photoresist pattern.

4. The method of claim 2, wherein the forming of the grid-shaped auxiliary electrode part comprises using an inkjet printing method, an electrohydrodynamic printing method, a gravure offset printing, a gravure printing, a reverse offset printing or a screen printing.

5. The method of claim 2, wherein the forming of the plate-shaped auxiliary electrode part comprises:
   forming a photoresist layer on the self-assembled monolayer;
   forming a photoresist pattern by etching the photoresist layer;
   forming a conductive material layer on the self-assembled monolayer;
   forming a protective layer on the conductive material layer;
   removing a portion of the protective layer to expose a top surface of the conductive material layer in contact with a top surface of the photoresist pattern;
   exposing the top surface of the photoresist pattern by etching the conductive material layer; and
   removing the entire protective layer.

6. The method of claim 2, further comprising removing the support layer after the transferring of the top electrode.

7. The method of claim 2, further comprising:
   providing an auxiliary substrate under the self-assembled monolayer;
   forming a photoresist pattern between the auxiliary substrate and the self-assembled monolayer; and
   lifting off the photoresist pattern after the forming of the auxiliary electrode part.

8. A method of manufacturing an organic light-emitting device, the method comprising:
   providing a substrate;
   forming a bottom electrode on the substrate;

forming an organic light-emitting layer on the bottom electrode; and transferring a top electrode on the organic light-emitting layer, wherein the transferring of the top electrode comprises:
providing a graphene layer;
forming an auxiliary electrode film on the graphene layer; and
bonding a top surface of the organic light-emitting layer and a bottom surface of the graphene layer after the auxiliary electrode film has been formed, wherein forming the auxiliary electrode film on the graphene layer comprises:
providing a self-assembled monolayer;
forming an auxiliary electrode part on the self-assembled monolayer; and
removing the self-assembled monolayer.

9. The method of claim 8, wherein the auxiliary electrode part is a grid-shaped electrode part or a plate-shaped auxiliary electrode part, and
wherein forming the auxiliary electrode film on the graphene layer further comprises:
forming an adhesive layer on the auxiliary electrode part;
forming a support layer on the adhesive layer; and
bonding a bottom surface of the auxiliary electrode part and a top surface of the graphene layer.

10. The method of claim 8, wherein forming the auxiliary electrode film on the graphene layer further comprises:
providing an auxiliary substrate;
performing a plasma treatment on a top surface of the auxiliary substrate; and
removing the auxiliary substrate.

11. The method of claim 10, wherein the auxiliary electrode part is a grid-shaped electrode part or a plate-shaped auxiliary electrode part, and
wherein forming the auxiliary electrode film on the graphene layer further comprises:
forming an adhesive layer on the auxiliary electrode part;
forming a support layer on the adhesive layer; and
bonding a bottom surface of the auxiliary electrode part and a top surface of the graphene layer.

12. The method of claim 8, wherein forming the auxiliary electrode film on the graphene layer further comprises forming a conductive polymer layer on the graphene layer.

13. The method of claim 8, wherein forming the auxiliary electrode film on the graphene layer further comprises:
forming a photoresist pattern on the graphene layer;
forming a conductive material layer over the graphene layer; and
lifting off the photoresist pattern to form a grid-shaped auxiliary electrode part.

* * * * *